(12) United States Patent
Kim et al.

(10) Patent No.: US 7,727,797 B2
(45) Date of Patent: Jun. 1, 2010

(54) METHOD FOR MANUFACTURING ORGANIC THIN FILM TRANSISTOR SUBSTRATE

(75) Inventors: Young-Min Kim, Yongin-si (KR); Bo-Sung Kim, Seoul (KR); Bo-Kyoung Ahn, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/051,530

(22) Filed: Mar. 19, 2008

(65) Prior Publication Data
US 2008/0241990 A1 Oct. 2, 2008

(30) Foreign Application Priority Data
Mar. 29, 2007 (KR) .................. 10-2007-0030975

(51) Int. Cl.
*H01L 51/40* (2006.01)
(52) U.S. Cl. .................. 438/99; 438/82; 438/705; 438/E21.232; 257/40

(58) Field of Classification Search .............. 438/99, 438/704–717, 745–751, 82; 257/40
See application file for complete search history.

(56) References Cited

U.S. PATENT DOCUMENTS
6,750,149 B2 * 6/2004 Sasaki et al. .............. 438/705
2007/0134832 A1 * 6/2007 Oh et al. ................... 438/30

FOREIGN PATENT DOCUMENTS
JP 2005-228968 8/2005
JP 2006-165584 6/2006
JP 2006-173532 6/2006

* cited by examiner

*Primary Examiner*—Dung A. Le
(74) *Attorney, Agent, or Firm*—Innovation Counsel LLP

(57) ABSTRACT

A method for manufacturing an organic thin film transistor substrate comprising forming a gate electrode on a substrate, forming a gate insulating layer on the gate electrode, defining a channel region on the gate insulating layer between a source electrode and a drain electrode, neutralizing the channel region, forming a bank insulating layer on the source electrode and the drain electrode, and forming an organic semiconductor layer in a region prepared by the bank insulating layer.

14 Claims, 7 Drawing Sheets

METHOD FOR MANUFACTURING ORGANIC THIN FILM TRANSISTOR SUBSTRATE

REFERENCE TO RELATED APPLICATIONS

This application claims priority to Korean Patent Application No. 2007-0030975 filed on Mar. 29, 2007, and all the benefits accruing therefrom under 35 U.S.C. §119, the contents of which are herein incorporated by reference in their entirety.

BACKGROUND OF THE INVENTION

1. Field of the Invention

The present invention relates to a method for manufacturing an organic thin film transistor substrate and, more particularly, to a method for manufacturing an organic thin film transistor substrate of a bottom gate type.

2. Description of the Related Art

Generally, a liquid crystal display (LCD) device displays image by controlling the transmittance of light generated from a backlight unit. Light transmittance is controlled by the rotation of liquid crystal molecules in response to a changing data voltage applied to pixels arranged in a matrix shape on the LCD panel. A thin film transistor (TFT) is used as a switching element for supplying a pixel signal and as driving element for each of the liquid crystal cells. The TFT has a semiconductor layer that includes a channel region formed between a source region and a drain region, a gate electrode formed in a region corresponding to the semiconductor layer, an insulating layer for insulating the gate electrode from the semiconductor layer, and source and drain electrodes. An organic TFT has an organic semiconductor layer. The organic semiconductor material may be formed through a low temperature process and may be used on a plastic substrate. The organic TFT is formed through patterning using a thin film depositing (coating) process, a photolithography process and an etching process.

During the photolithography process and the etching process, the organic semiconductor material may be exposed to chemicals such as an etchant of a strong acid that may damage a layer that insulates the gate electrode. Particularly, metal etchants may be absorbed through the surface of the gate insulating layer and adversely affect the electrical characteristics of the organic thin film transistor.

BRIEF SUMMARY OF THE INVENTION

An exemplary embodiment of the invention provides a method for manufacturing an organic thin film transistor using alkali treatment of a surface of the gate insulating layer before the organic semiconductor layer is formed to prevent the gate insulating layer from being chemically damaged.

In an exemplary embodiment, a method for manufacturing an organic TFT substrate comprises forming a gate electrode on a substrate, forming a gate insulating layer on the gate electrode, defining a channel region on the gate insulating layer between a source electrode and a drain electrode, neutralizing the channel region, forming a bank insulating layer on the source electrode and the drain electrode, and forming an organic semiconductor layer in a region prepared by the bank insulating layer.

The neutralizing of the channel region may comprise alkali treating the channel region.

The alkali treating of the channel region may comprise spraying alkali solution on the substrate on which the source electrode and the drain electrode are formed.

The alkali treating the channel region may comprise dipping the substrate, on which the source electrode and the drain electrode are formed, in an alkali solution.

The alkali solution may comprise tetramethylammonium hydroxide (TMAH).

The concentration of the tetramethylammonium hydroxide (TMAH) solution may be about 2 to 3%.

The treating of the channel region may further comprise cleaning the substrate, on which the source electrode and the drain electrode are formed, using deionized water (DI).

The treating the channel region may further comprise drying the cleaned substrate.

A method for manufacturing an organic TFT substrate comprises forming a gate electrode on a substrate, forming an insulating layer on the gate electrode, defining a channel region on the insulating layer between a source electrode and a drain electrode, neutralizing the channel region, and forming an organic semiconductor in the channel region.

The alkali treating the channel region may comprise spraying an alkali solution on the substrate on which the source electrode and the drain electrode are formed.

The alkali treating the channel region may comprise dipping the substrate, on which the source electrode and the drain electrode are formed, in an alkali solution.

The alkali solution may comprise tetramethylammonium hydroxide (TMAH).

The concentration of the tetramethylammonium hydroxide (TMAH) solution may be about 2 to 3%.

The alkali treating the channel region may further comprise cleaning the substrate, on which the source electrode and the drain electrode are formed, using deionized water (DI).

The alkali treating the channel region may further comprise drying the cleaned substrate.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Hereinafter, the present invention will be described in detail with reference to the accompanying drawings.

Figure 1:
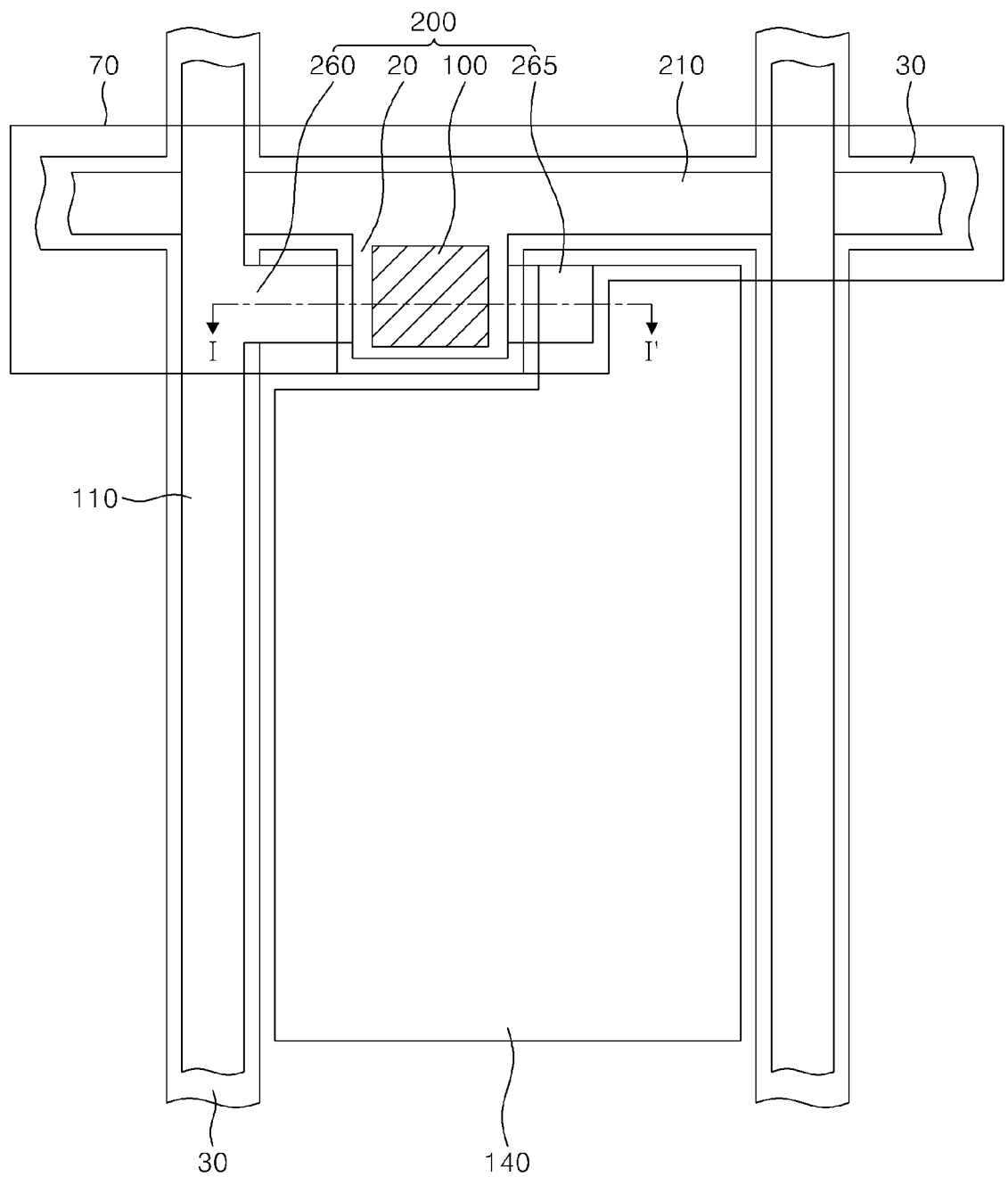
FIG. 1 is a plane view illustrating an organic TFT substrate according to an exemplary embodiment of the present invention.
Figure 2:
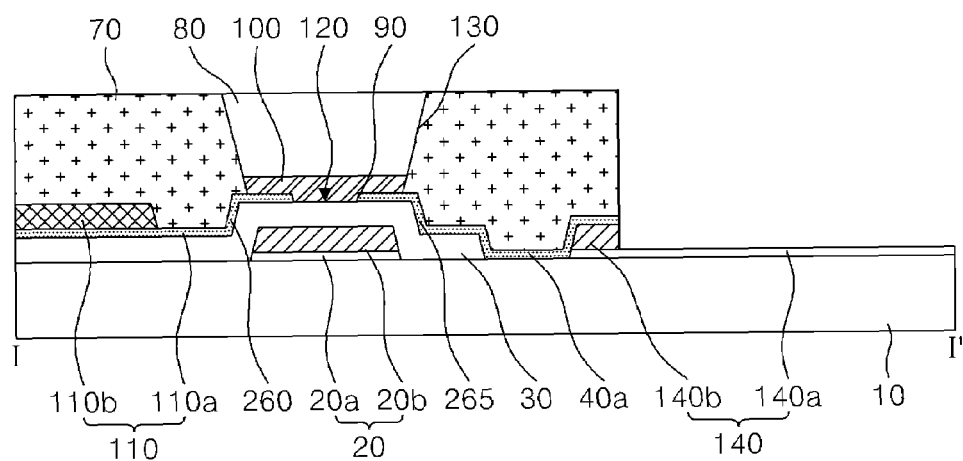
FIG. 2 is a cross-sectional view taken along a line 1-1' shown in FIG. 1.

FIG. 1 is a plane view illustrating an organic TFT substrate according to an exemplary embodiment of the present invention. FIG. 2 is a cross-sectional view taken along a line 1-1' shown in FIG. 1.

Referring to FIGS. 1 and 2, an organic TFT substrate 10 according to an exemplary embodiment has a gate line 210, a gate insulating layer 30, a data line 110, an organic TFT 200 coupled with the gate and data lines 210 and 110, a bank insulating layer 70, a protection layer 80 and a pixel electrode 140.

The substrate may be a glass substrate, a plastic substrate, a sapphire substrate or a quartz substrate. Preferably, the substrate 10 is a flexible substrate of plastic.

The gate line 210 supplies a gate on/off voltage from a gate driver (not shown) to a gate electrode 20 of the organic TFT 200. The gate electrode 20 is made of the same conductive material as the gate line 210.

The gate line 210 and the gate electrode 20 have a stacked structure comprised of a first conductive layer 20a and 140a and a second conductive layer 20b and 140b formed on the substrate 10.

The first conductive layer 20a and 140a includes a transparent conductive layer such as indium tin oxide (ITO), indium zinc oxide (IZO), etc.

The second conductive layer 20b and 140b includes tantalum (Ta), tungsten (W), titanium (Ti), molybdenum (Mo), aluminum (Al), gold (Au), copper (Cu), chromium (Cr), yttrium (Y), zinc (Zn), hafnium (Hf), zirconium (Zr) or alloy thereof.

Thus, the first conductive layer 20a and 140a of the gate line 210 and the gate electrode 20 includes a transparent conductive layer, and the second conductive layer 20b and 140b has an opaque conductive layer.

The gate insulating layer 30 improves the characteristics of the on-current Ion and the off-current Ioff of the organic TFT 200. The gate insulating layer 30 is formed between the gate line 210 and the data line 110 to insulate the gate line 210 from the data line 110. The gate insulating layer 30 is formed between the gate electrode 20 and the source and drain electrodes 260 and 265 to insulate the gate electrode 20 from the source and drain electrodes 260 and 265.

The gate insulating layer 30 may have an inorganic insulating layer such as a silicon nitride (SiNx) layer or a silicon oxide (SiOx) layer, or an organic insulating layer. The gate insulating layer 30 may also have a double layered insulating layer having an organic insulating layer and an inorganic insulating layer.

The data line 110 receives a pixel signal from a data driver (not shown). The data line 110 crosses the gate line 210, with the gate insulating layer 30 interposed between the gate line 210 and the data line 110.

The data line 110 has a multilayered structure having a third conductive layer 110a and a fourth conductive layer 110b on the gate insulating layer 30.

The third conductive layer 110a includes a transparent conductive material such as indium tin oxide (ITO), indium zinc oxide (IZO), etc.

The further conductive layer 110b has tantalum (Ta), tungsten (W), titanium (Ti), molybdenum (Mo), aluminum (Al), gold (Au), copper (Cu), chromium (Cr), yttrium (Y), zinc (Zn), hafnium (Hf), zirconium (Zr) or alloy thereof.

The third conductive layer 110a of the data line 110 has a transparent conductive layer, and the fourth conductive layer 110b has an opaque conductive layer.

The organic TFT 200 applies the pixel signal from the data line 110 to the pixel electrode 140 in response to a gate on/off voltage applied from the gate line 210.

The organic TFT 200 has a gate electrode protruded from the gate line 210, a source electrode 260 protruded from the data line, a drain electrode 265 facing the source electrode 260 and coupled with the pixel electrode 140, and an organic semiconductor layer 100 forming a channel between the source and drain electrodes 260 and 265 that overlap the gate insulating layer 30.

The gate electrode 20 has same structure and is of the same material as the gate line 210. The gate electrode 20 is formed of a first conductive layer having a transparent conductive layer and a second conductive layer having an opaque conductive layer. The gate electrode 20 overlaps the organic semiconductor layer 100. Gate insulating layer 30 insulates gate electrode 20 from the organic semiconductor layer 100.

The third conductive layer 110a of the transparent conductive layer remains from the third and fourth conductive layers 110a and 110b to form the source electrode 260 and the drain electrode 265.

The organic semiconductor layer 100 forms a channel between the source electrode 260 and the drain electrode 265 in the overlapped region between the organic semiconductor layer 100 and the gate electrode 20.

Particularly, the organic semiconductor layer 100 is formed in a first hole 90 and a second hole 130 that are formed in the channel region 120 between the source electrode 260 and the drain electrode 265 on the gate insulating layer 30.

That is, the organic semiconductor layer 100 is formed at the same height at that at which the source electrode 260 and the drain electrode 265 are formed. Therefore, the organic semiconductor layer 100 is uniformly formed at an interface level of the gate insulating layer 30.

The organic semiconductor layer 100 is made of an organic semiconductor material such as pentacene, tetracene, anthracene, naphthalene, α-6T, α-4T, perylene, derivatives of perylene, rubrene, derivatives of rubrene, coronene, derivatives of coronene, perylene tetracarboxylic diimide, derivatives of perylene tetracarboxylic diimide, phthalocyanine, derivatives of phthalocyanine, naphthalene tetracarboxylic diimide, derivatives of naphthalene tetracarboxylic diimide, naphthalene tetracarboxylic dianhydride, derivatives of naphthalene tetracarboxylic dianhydride, conjugated high polymer derivatives having substituted or non-substituted thiophene, conjugated high polymer derivatives having substituted fluorine, etc.

The bank insulating layer 70 includes a second hole 130. A lower surface of the second hole 130 formed in the bank insulating layer 70 and may be deeper than the first hole 90 or may have the same depth as the upper surface of the first hole 90.

The protecting layer 80 is formed on the organic semiconductor layer 100 to protect the organic semiconductor layer 100 in a region of the second hole 130 of the bank insulating layer 70. Therefore, the protecting layer 80 is formed having the height at which the bank insulating layer 70 is formed in the second hole 130.

The pixel electrode 140 supplies a voltage to liquid crystal molecules formed between the organic TFT substrate and a color filter substrate (not shown).

The pixel electrode 140 is coupled with the organic TFT 200, and the first conductive layer 140a and 140b of the gate electrode 20 and the gate line 210 is formed as the pixel electrode 140. The pixel electrode 140 is coupled with an extended portion of the drain electrode 265.

The pixel electrode 140 has the transparent and conductive material, for example, indium tin oxide (ITO), indium zinc oxide (IZO), indium tin zinc oxide (ITZO), etc.

Referring to FIGS. 3A to 3F, a method for manufacturing an organic TFT substrate will be explained.

An organic TFT substrate having a gate electrode 20 is formed on a substrate 10 using a first mask. A gate insulating layer 30 is formed on the gate electrode 20 using a second mask.

The organic TFT substrate of the present invention includes a source electrode 260 and a drain electrode 265 formed on the gate insulating layer 30. A bank insulating layer 70 is formed using a fourth mask and an organic semiconductor layer 100 is formed in a region in which the bank insulating layer 70 is formed.

Figure 3A:
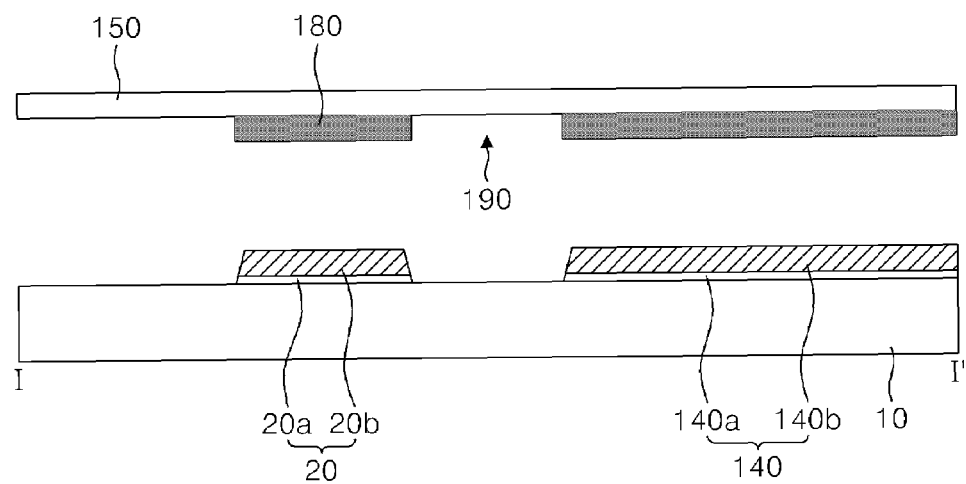
FIG. 3A is a cross-sectional view illustrating forming a first conductive pattern of a method for manufacturing an organic TFT substrate according to an exemplary embodiment of the present invention.

FIG. 3A is a cross-sectional view illustrating forming a first conductive pattern of a method for manufacturing an organic TFT substrate according to an exemplary embodiment of the present invention.

Referring to FIG. 3A, a first conductive pattern having a gate line 210, the gate electrode 20 and a pixel electrode 140 is formed on the substrate 10 using the first mask 150.

Particularly, a first conductive layer 20a and 140a and a second conductive layer 20b and 140b are sequentially stacked on the substrate 10 through a deposition method such as sputtering.

The first conductive layer 20a and 140a is formed by depositing a transparent and conductive layer such as an indium tin oxide (ITO) layer, an indium zinc oxide (IZO) layer, etc.

The first conductive layer 20a and 140a is formed by at least one of amorphous indium tin oxide (a-ITO), poly indium tin oxide (poly-ITO) and a polymer conductive material such as polyethyldioxy thiophen (PEDOT) referring to an etching ratio.

The second conductive layer 20b and 140b may have tantalum (Ta), tungsten (W), titanium (Ti), molybdenum (Mo), aluminum (Al), gold (Au), copper (Cu), chromium (Cr), yttrium (Y), zinc (Zn), hafnium (Hf), zirconium (Zr) or alloy thereof.

When the gate electrode 20 has the alloy, the gate electrode 20 may have a single layer having a metallic material such as a Cu alloy, an Al alloy, a Mo alloy, a Cr alloy, etc., or may have a multi layer thereof.

In another exemplary embodiment, the gate electrode 20 may have a doped silicon layer or a conductive organic layer.

A positive photoresist is coated on entire of the substrate 10 on which the gate metal layer is formed through a spinless coating method or a spin coating method. Here, the first mask 150 is aligned on the substrate 10.

The first mask 150 has a blocking region 180 having a blocking layer and a transmission region 190 only having a glass substrate on the glass substrate.

The blocking region 180 blocks ultraviolet during an exposing process, so that the gate metal is patterned through a photolithography process and an etching process. Any remaining photoresist is stripped to form a first conductive pattern having the gate line 210, the gate electrode 20 and the pixel electrode 140 is formed.

The transmission region 190 transmits the ultraviolet during the exposing process to form an opposite region against the first conductive pattern that is formed through the etching process.

Before the gate electrode 20 is formed, a barrier layer (not shown) may be formed on the substrate 10. The barrier layer protects the organic semiconductor layer 100 during subsequent processes from water or an organic gas that is in-flowed from an outer space or the substrate.

Figure 3B:
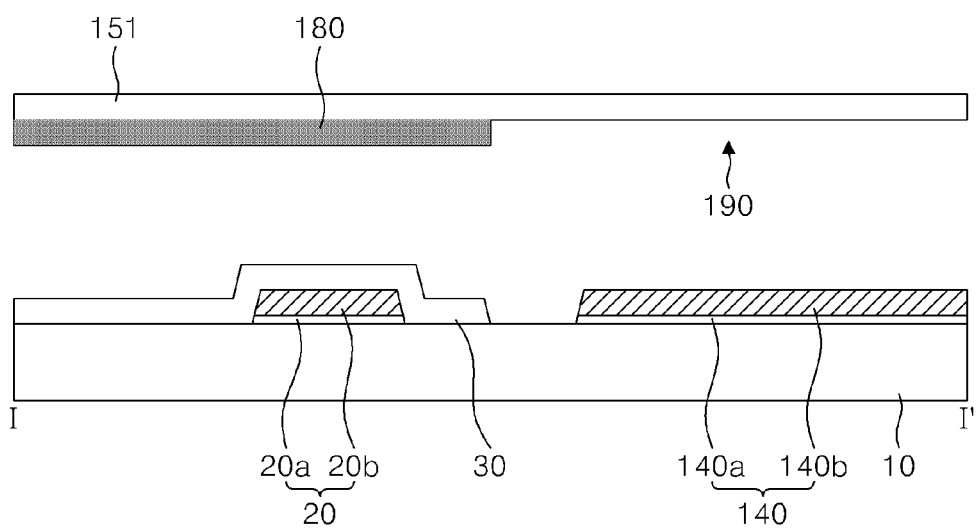
FIG. 3B is a cross-sectional view illustrating forming a gate insulating layer of a method for manufacturing an organic TFT substrate according to an exemplary embodiment of the present invention.

FIG. 3B is a cross-sectional view illustrating forming a gate insulating layer of a method for manufacturing an organic TFT substrate according to an exemplary embodiment of the present invention.

Referring to FIG. 3B, the gate insulating layer 30 is formed on the gate electrode through the second mask process. The gate insulating layer 30 may have an inorganic insulating layer or an organic insulating layer, or a double layered insulating layer stacked by an inorganic insulating layer and an organic insulating layer.

When the gate insulating layer 30 is formed using the inorganic insulating layer, the insulating layer may include at lease one layer selected from the group consisting of a silicon oxide layer, a silicon nitride layer and a silicon oxinitride layer, a metal oxide layer or a ferroelectric layer.

The metal oxide layer may include at least one layer selected from the group consisting of an aluminum oxide (Al2O3) layer, an Yttrium oxide (Y2O3) layer, a zinc oxide (ZnO2) layer, a zirconium oxide (ZrO2) layer, a tantalum oxide (Ta2O5) layer and a titanium oxide (TiO2) layer. The ferroelectric layer may include at east one layer selected from the group consisting of PbZxTi1-xO3 (PZT) layer, Bi4Ti3O12 layer, BaMgF4 layer and BaxSr1-xTiO3 (BST) layer.

The inorganic insulating layer may be formed through a physical vapor deposition (PVD) method, a chemical vapor deposition (CVD) method, a laser ablation method or a sol gel spin coating method.

Particularly, the inorganic insulating layer may be formed through an evaporation method, a sputtering method, a low plasma chemical vapor deposition (LPCVD) method or plasma enhanced chemical vapor deposition (PECVD) method.

In another exemplary embodiment, the inorganic insulating layer may be an oxide of an upper portion of the gate conductive layer that is formed through partially oxidizing the gate electrode.

Particularly, the gate electrode may be oxidized through an anodic oxidization method, plasma oxidization or UV oxon oxidization.

The gate electrode may include at least one material selected from the group consisting of aluminum, yttrium, zinc, hafnium, zirconium, tantalum, titanium and an alloy thereof.

Preferably, the gate electrode may be an aluminum-molybdenum alloy layer or a titanium layer.

The organic gate insulating layer may be used alone, or may be formed on the inorganic gate insulating layer. Here, the organic gate insulating layer may have at least one selected from the group consisting of vinyl based polymer, styrene based polymer, acrylic based polymer, epoxy based polymer, ester based polymer, phenol based polymer, amide based polymer and alkene based polymer.

Particularly, the organic gate insulating layer is at least one selected from the group consisting of polyethylene (PE), polypropylene (PP), polytetrafluoroethylene (PTFE), polyvinylchloride (PVC), polyvinylalcohol (PVA), polyvinylpyrrolidone (PVP), polystyrene (PS), polyacrylate, polymethacrylate (PMMA), polycrylonitrile (PAN), polycarbonate (PC), polyethylenterephthalate (PET), parylene, polyphenylenesulfide (PPS), polyimide (PI), benzocyclobutene (BCB) and cyclopentane (CyPe).

The organic gate insulating layer may be formed through a vapor deposition method, a sublimation method or a solution method.

The organic gate insulating layer may be formed through a thermal evaporation method, an organic molecular beam deposition (OMBD) method, a spin coating method or a dip coating method.

The organic gate insulating layer and the inorganic gate insulating layer form the gate insulating layer 30 of the organic TFT 200. In another exemplary embodiment, the gate insulating layer 30 may only have the inorganic gate insulating layer or the organic gate insulating layer.

Photoresist is coated on entire surface of the gate insulating layer, and a second mask 151 is aligned on the substrate 10. The second mask 151, like the first mask 150, has a blocking region 180 in which a blocking layer is formed on a glass substrate, and a transmission region 190 in which only the glass substrate is disposed.

The blocking region 180 blocks ultraviolet during an exposing process, so that the gate insulating layer 30 remains during a photolithography process and an etching process. Also, the photoresist is stripped to pattern the gate insulating layer 30.

Figure 3C:
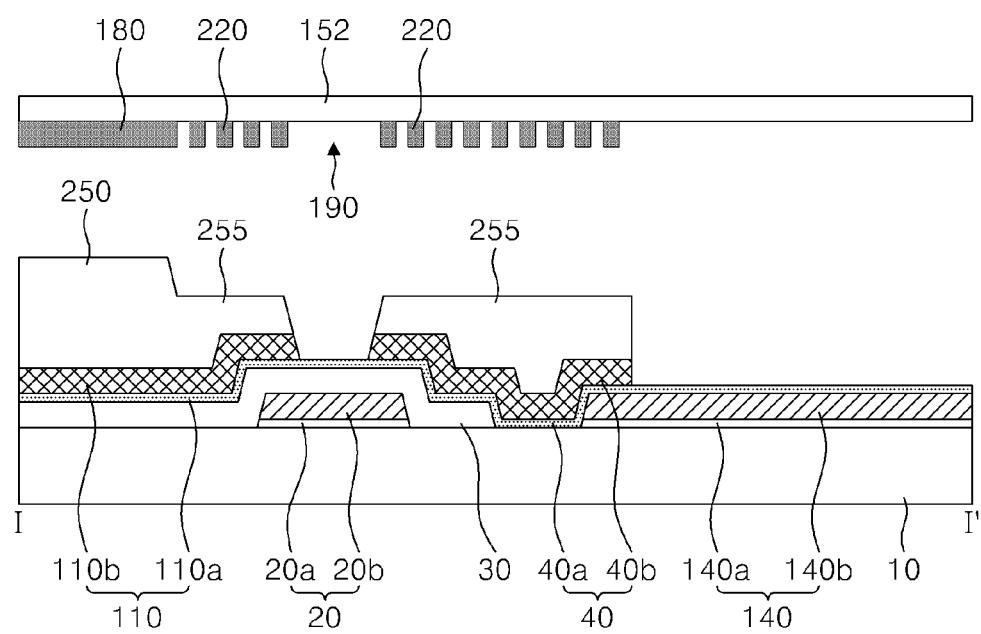
FIGS. 3C to 3E are cross-sectional views illustrating forming a second conductive pattern of a method for manufacturing an organic TFT substrate according to an exemplary embodiment of the present invention.
Figure 3D:
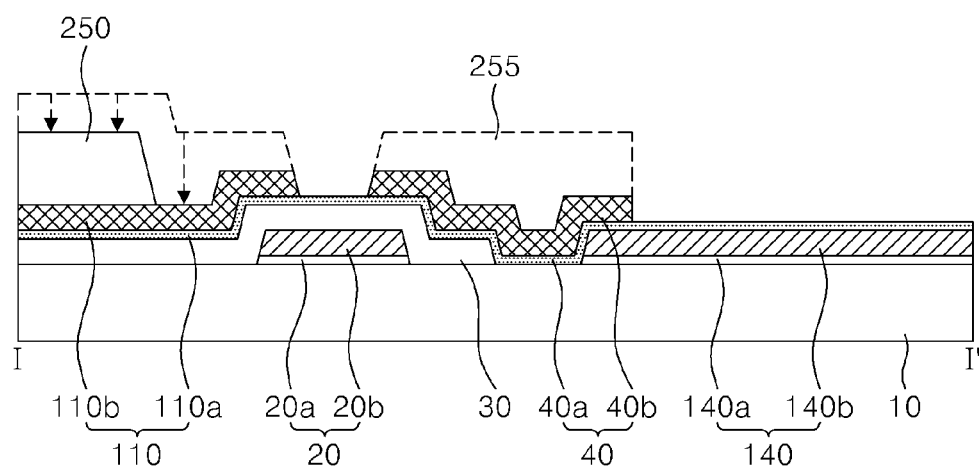
Figure 3E:
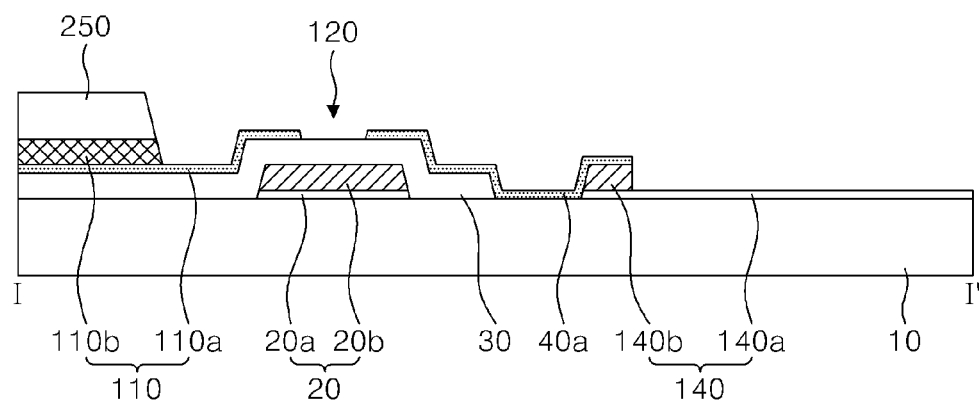

FIGS. 3C to 3E are cross-sectional views illustrating forming a second conductive pattern of a method for manufacturing an organic TFT substrate according to an exemplary embodiment of the present invention.

Referring to FIG. 3C, a second conductive pattern having a source electrode 260, a drain electrode 265 and a data line 110 is formed on the substrate 10 through a third mask process on which the gate insulating layer 30 is formed.

Particularly, third and fourth conductive layers 110a and 110b are formed on the gate insulating layer 30 and the pixel electrode 140 through a deposition method such as a sputtering.

A transparent and conductive layer such as an indium tin oxide (ITO) layer, indium zinc oxide (IZO), an indium tin zinc oxide (ITZO) layer, etc., is deposited through the deposition method such as the sputtering to form the third conductive layer 110a and 40a.

Then, at least one opaque metal selected from the group consisting of copper, aluminum, molybdenum, chromium, copper alloy, aluminum alloy, molybdenum alloy and chromium alloy is deposited to form the fourth conductive layer 110b and 40b.

Then, photoresist is coated on the fourth conductive layer 110b and 40b.

After the third and fourth conductive layers 110a and 110b are formed, the second conductive pattern is patterned through a photolithography process and an etching process using the third mask 152 to form the source electrode 260, the drain electrode 265 and the data line 110.

Particularly, the photoresist is coated on the fourth conductive layer 40b and 110b, and the photoresist is exposed using a translucent mask or a slit mask and is developed to form a first photoresist pattern 250 and a second photoresist pattern 255 having different thickness.

The slit mask 152 has a blocking region 180, a slit region 220 having a plurality of slits and a transmission region 190 on a glass substrate.

The block region 180 is on a region for forming the data line to block ultraviolet during an exposing process so that the first photoresist pattern 250 remains after a developing process.

The slit region 220 is in a region for forming the source electrode 260 and the drain electrode 265 to diffract the ultraviolet light during the exposing process so that the second photoresist pattern 255 having thinner thickness than the first photoresist pattern 250 remains. The transmission region 190 transmits all the ultraviolet to remove the photoresist after the developing process. The fourth conductive layer 40b and 110b is patterned through a first etching process using the photoresist pattern as a mask to expose the third conductive layer 40a and 110a.

Referring to FIG. 3D, an ashing process using an oxygen (O2) plasma is performed on the substrate using the slit mask 152 on which the photoresist pattern having different thickness. Therefore, the thickness of the first photoresist pattern 250 is decreased, and the second photoresist pattern 255 is removed.

Referring to FIG. 3E, a second etching process is performed using the first photoresist pattern 250 remaining after the ashing process as a mask. The exposed third conductive layer 40a and 110a is removed through the second etching process. Thus, the data line 110, the source electrode 260 and the drain electrode 265 are formed from the third and fourth conductive layers 110a and 110b.

The exposed fourth conductive layer 110b and the second conductive layer 140b in a region on which the pixel electrode 140 will be formed are removed through a third etching process using the first photoresist pattern 250 as a mask. Then, the remaining first photoresist 250 is stripped.

Then, the source electrode 260 and the drain electrode 265 are formed by a material having a predetermined work function in response to ionization energy of the organic semiconductor layer 100.

The second conductive pattern is exposed through chemicals during processes such as an etching process. Particularly, the etchant making contact with the surface of the gate insulating layer 30 is acid to be absorbed through the surface of the gate insulating layer 30 to increase acidity of the gate insulating layer 30.

Thus, an alkali treatment is performed on the gate insulating layer 30 on which the channel is formed to prevent the acidity of the gate insulating layer 30 from being increased and to improve characteristics of an on current and an off current during turn on and turn off operation of the organic TFT 200.

The surface of the gate insulating layer 30 of the channel region 120 is alkali treated, so that the gate insulating layer 30 is neutralized.

Figure 3F:
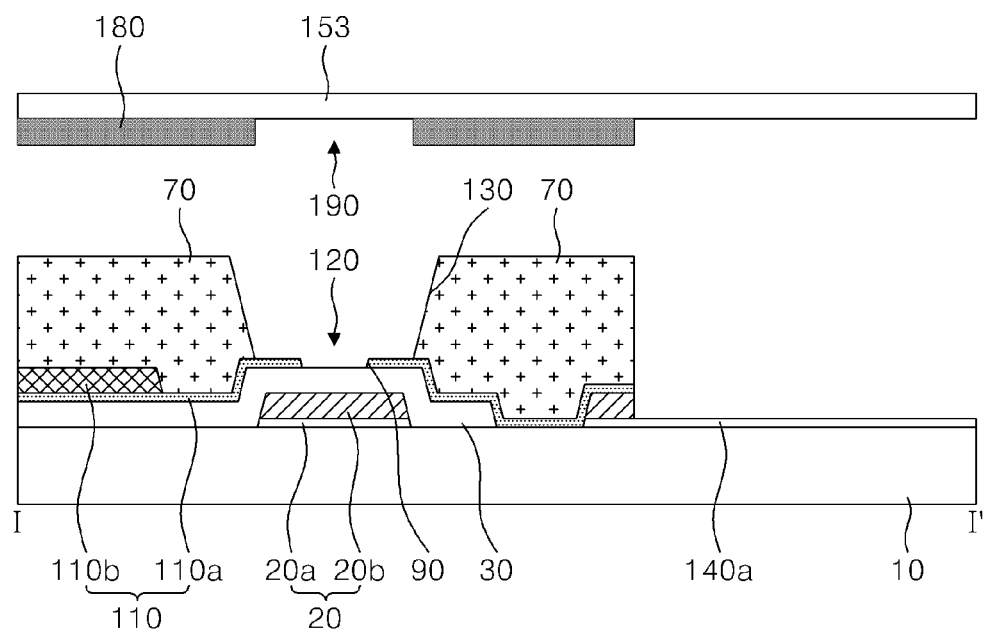
FIG. 3F is a cross-sectional view illustrating forming a bank insulating layer of a method for manufacturing an organic TFT substrate according to an exemplary embodiment of the present invention.

FIG. 3F is a cross-sectional view illustrating forming a bank insulating layer of a method for manufacturing an organic TFT substrate according to an exemplary embodiment of the present invention.

Referring to FIG. 3F, a bank insulating layer 70 is formed through a fourth mask process.

Particularly, a photo sensitive organic insulating material is coated through a method such as a spinless coating or a spin coating on the substrate 10 on which the source electrode 260, the drain electrode 265 and the data line 110 are formed.

Then, a fourth mask 153 is aligned on the substrate, and the bank insulating layer 70 having a second hole 130 on the channel portion is formed through an exposing process using a fourth mask 153 and a developing process.

A blocking region 180 of the fourth mask 153 blocks ultraviolet during the exposing process to form the back insulating layer 70 in a region corresponding to the blocking region 180. A transmission region 190 transmits all the ultraviolet light during the exposing process to form the second hole 130 after the developing process. That is, the bank insulating layer 70 remains the photosensitive organic insulating material after the exposing process and the developing process.

As the size of the second hole 130 is increased, a design margin for injecting the organic semiconductor layer 100 is increased.

Figure 3G:
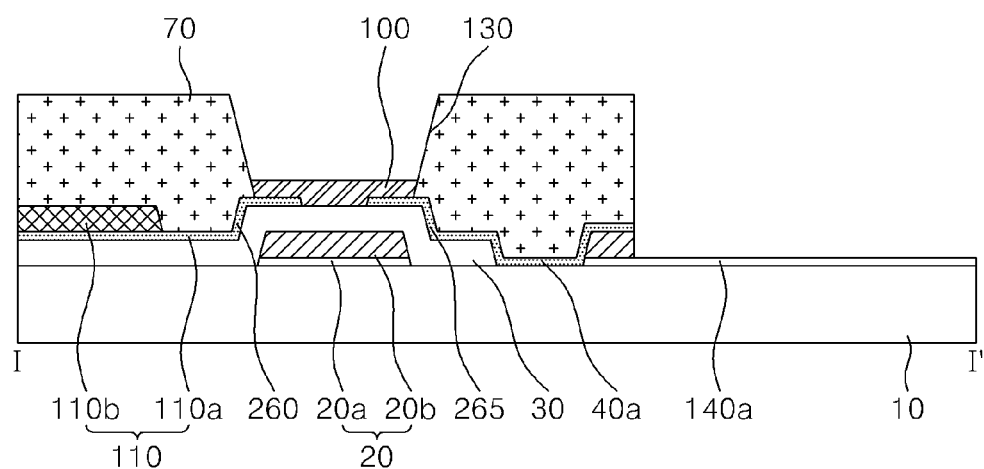
FIGS. 3G to 3H are cross-sectional views illustrating forming an organic semiconductor layer of a method for manufacturing an organic TFT substrate according to an exemplary embodiment of the present invention.
Figure 3H:
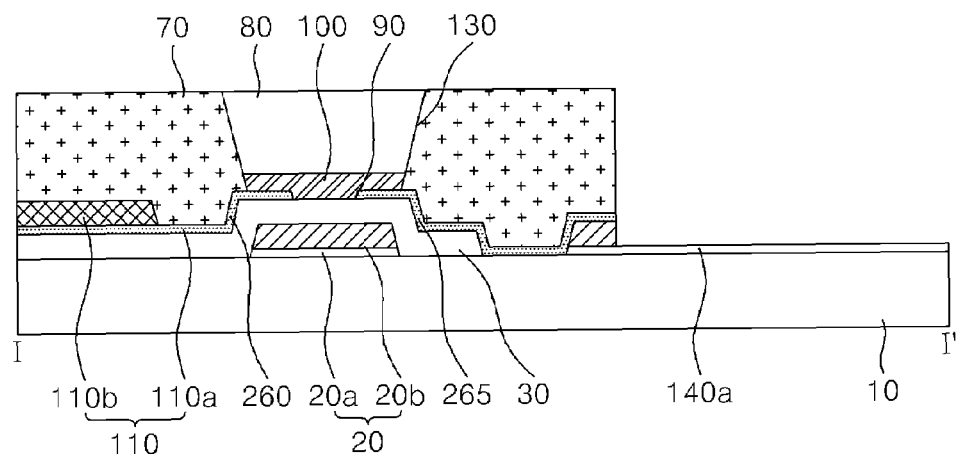

FIGS. 3G to 3H are cross-sectional views illustrating forming an organic semiconductor layer of a method for manufacturing an organic TFT substrate according to an exemplary embodiment of the present invention.

Referring to FIGS. 3G to 3H, the organic semiconductor layer 100 of liquid state is formed in the first hole 90 and the second hole 130 formed by the bank insulating layer 70.

The organic semiconductor layer 100 may be formed through a vapor deposition method, a sublimation method or a solution method. Also, the organic semiconductor layer 100 may be formed through a thermal evaporation method, an organic molecular beam deposition (OMBD) method, a spin coating method or a dip coating method.

Preferable, the organic semiconductor of the liquid state is injected into the second hole 130 formed by the bank insulating layer 70 through an inkjet method using an inkjet ejecting device. Therefore, the organic semiconductor of the liquid state, which is injected into the first hole 90 and the second hole 130 is solidified so that the organic semiconductor becomes a solid state.

The organic semiconductor layer 100 ohmic-contacts with the source electrode 260 and the drain electrode 265 through a self-assembled monolayer (SAM) process.

Particularly, in the SAM process, molecules of the SAM are formed on the substrate 10 through a wet method in which reaction is performed in liquid solution or a vacuum deposition, and light is irradiated on the molecules of the SAM so that the molecules of the SAM are polymerized. Then, heat or electron beam is irradiated on the polymerized molecules to form the SAM structure.

The difference between the work functions of each of the source and drain electrodes 110 and 40 and the organic semiconductor layer 100 is decreased through the SAM process.

Therefore, hole injection from the source and drain electrodes 260 and 265 to the organic semiconductor layer 100 is easier which decreases the ohmic resistance between each of the source and drain electrodes 260 and 265 and the organic semiconductor layer 100.

An organic insulating liquid is applied on the organic semiconductor layer 100 and solidified to form a protecting layer 80. The bank insulating layer 70 is formed through hydrophobic treatment before the organic semiconductor is applied.

Because the organic semiconductor and the organic layer 80 are hydrophilic, the bank insulating layer 70 is treated to be hydrophobic to prevent overflow of the organic semiconductor layer 100.

The organic semiconductor 100 may be patterned using a shadow mask, or through a lift off method.

The organic semiconductor layer 100 may consist of at least one selected from the group consisting of polyacetylene, polythiophene, poly(3-hexylthiophene-2.5-diyl) (P3HT), poly9(9-dioctylfluorene) (F8T2), polythienylene vinylene (PTV), pentacene, tetracene, rubrene and alpha-hexthienylen (a-6T).

The alkali treatment will be explained in detail with reference to FIG. 4.

Figure 4:
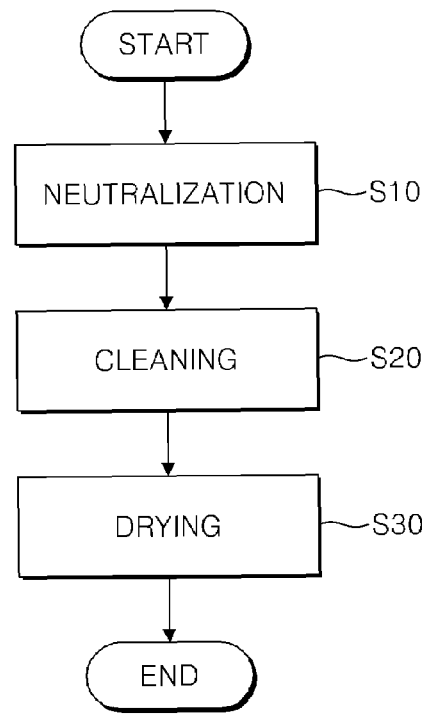
FIG. 4 is a flow chart illustrating a process of alkali treatment according to an exemplary embodiment of the present invention.

FIG. 4 is a flow chart illustrating a process of alkali treatment according to an exemplary embodiment of the present invention.

Referring to FIG. 4, the alkali treatment of a gate insulating layer according to an exemplary embodiment has a neutralization process (S10), a cleaning Process (S20) and a drying process (S30).

Firstly, in the neutralization process (S10), before the organic semiconductor layer 100 is formed, the gate insulating layer 30 exposed between the source electrode 260 and the drain electrode 265 is alkali treated to neutralize the surface of the gate insulating layer 30.

Preferably, a tetramethylammonium hydroxide (TMAH) of about 2 to 3% solution is used as an alkali solution. The alkali treatment is performed through dipping entire of the substrate 10 in a bath having the tetramethylammonium hydroxide (TMAH), or the tetramethylammonium hydroxide (TMAH) is sprayed on entire of the substrate 10.

The temperature of the alkali solution is about 10 to 50° C.

The alkali treatment is performed for about 1 to 10 seconds.

In the cleaning process, deionized water (DI) is used to remove salt that may be formed during the neutralization process of the acid of the metal etchant and the alkali. Ions of the deionized water are removed to have resistance more than 18 MΩ. The substrate 10 is fully dipped in the deionized water (DI) at a predetermined temperature, and is pulled out of the deionized water maintaining predetermined speed and time to be cleaned.

Finally, the cleaned substrate 10 is dried (S30) using isopropanol alcohol (IPA) solution), or by evaporative drying or spinning.

Figure 5:
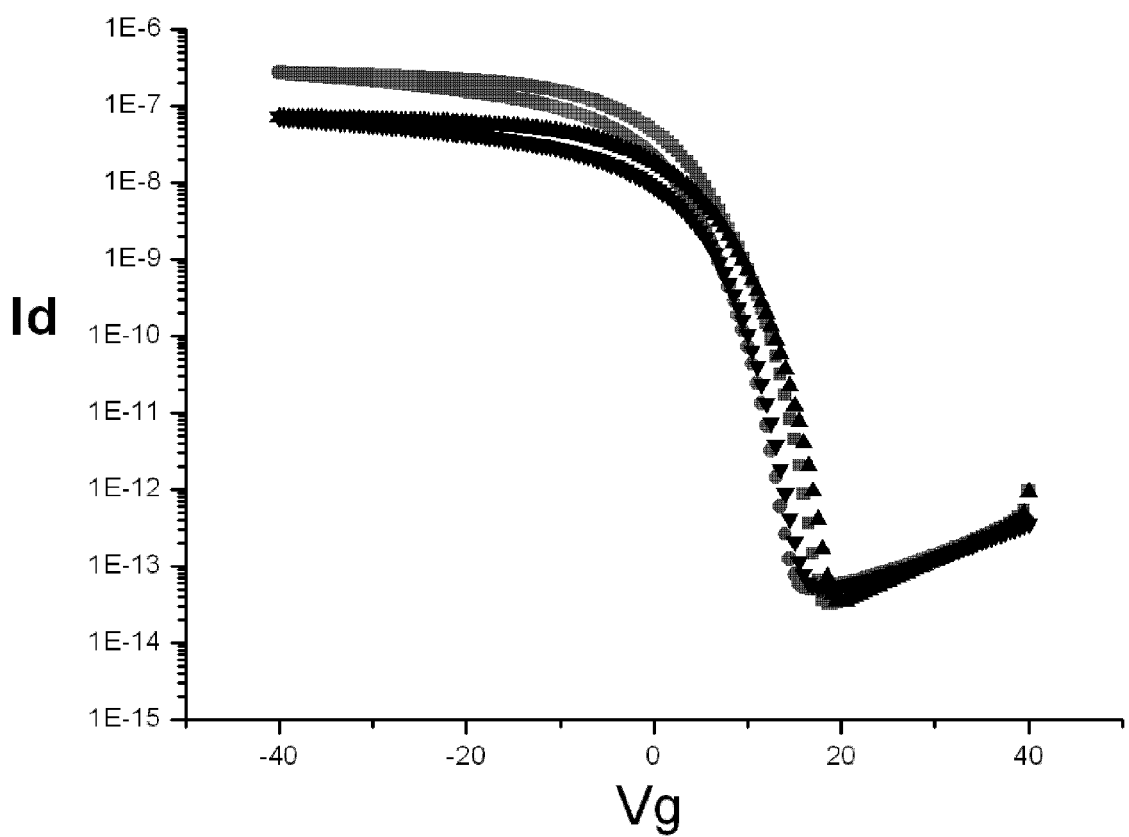
FIG. 5 is a graph illustrating a relationship between a gate voltage and a drain current of an organic TFT.

FIG. 5 is a graph illustrating a relationship between a gate voltage and a drain current of an organic TFT.

X-axis represents a gate voltage Vg, and Y-axis represents a drain current Id.

Referring to FIG. 5, before an organic semiconductor layer 100 is formed, tetramethylammonium hydroxide (TMAH) solution of about 2.38% is used to alkali treat a gate insulating layer 30.

Reference number 240 represents a characteristic variation curve of the organic TFT 200 on the alkali treated gate insulating layer 30. Reference number 250 represents a characteristic variation curve of a conventional organic TFT on a gate insulating layer without the alkali treatment.

'A' period represents a gate voltage ranging −40 to 0V, and the current flows to form an on-current region Ion.

'B' period represents a gate voltage ranging 20 to 40V, and the current does not flow to form an off-current region Ioff.

'C' period represents on current and off current during turning on and turning off of the organic TFT. Therefore, when 'C' period increased, characteristics of the organic TFT are improved.

'D' period represents improvement of the alkali treated organic TFT of the exemplary embodiment of the present invention compared with the conventional organic thin film transistor by about a half-order.

In FIG. 5, the curve 240 has higher drain current than the curve 250 during the period 'A'. Therefore, the drain current Id of the Y-axis does not show any difference during the period 'B' representing the off current Ioff, but shows a different 'D' in response to the alkali treatment during the period 'A' representing the on current Ion.

That is, the neutralization that recovers the chemical damage of the organic material affects the electron mobility of the organic TFT 200.

Therefore, when the organic TFT 200 of the exemplary embodiment of the present invention is formed having the alkali treated gate insulating layer 30, the characteristics of the organic TFT 200 is improved compared with the organic TFT without the alkali treatment.

The method for manufacturing the organic TFT substrate may be used for manufacturing a liquid crystal display (LCD) panel, and may also be used for manufacturing a flat panel display device.

According to an aspect of the present invention, the method for manufacturing the organic TFT substrate provides an organic TFT that has an organic semiconductor layer on an alkali treated surface of a gate insulating layer to neutralize the surface of the gate insulating layer. The gate insulating layer is protected to improve electrical characteristics of the organic TFT, and to improve electron mobility in a channel region.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method for manufacturing an organic thin film transistor substrate comprising:
   forming a gate electrode on a substrate;
   forming a gate insulating layer on the gate electrode;
   defining a channel region on the gate insulating layer between a source electrode and a drain electrode;
   alkali treating the channel region to neutralize the channel region;
   forming a bank insulating layer on the source electrode and the drain electrode; and
   forming an organic semiconductor layer in a region prepared by the bank insulating layer.

2. The method of claim 1 wherein the alkali treating the channel region comprises spraying alkali solution on the substrate on which the source electrode and the drain electrode are formed.

3. The method of claim 1 wherein the alkali treating the channel region comprises dipping the substrate, on which the source electrode and the drain electrode are formed, in an alkali solution.

4. The method of claims 3, wherein the alkali solution comprises tetramethylammonium hydroxide (TMAH).

5. The method of claim 4, wherein concentration of the tetramethylammonium hydroxide (TMAH) solution is about 2 to 3%.

6. The method of claim 1, wherein the alkali treating the channel region further comprises cleaning the substrate, on which the source electrode and the drain electrode are formed, using deionized water (DI).

7. The method of claim 6, wherein the alkali treating the channel region further comprises drying the cleaned substrate.

8. A method for manufacturing an organic thin film transistor substrate comprising:
   forming a gate electrode on a substrate;
   forming an insulating layer on the gate electrode;
   defining a channel region on the insulating layer between a source electrode and a drain electrode;
   alkali treating the channel region to neutralize the channel region; and
   forming an organic semiconductor in the channel region.

9. The method of claim 8, wherein the alkali treating the channel region comprises spraying an alkali solution on the substrate on which the source electrode and the drain electrode are formed.

10. The method of claim 8, wherein the alkali treating the channel region comprises dipping the substrate, on which the source electrode and the drain electrode are formed, in an alkali solution.

11. The method of claims 10, wherein the alkali solution comprises tetramethylammonium hydroxide (TMAH).

12. The method of claim 11, wherein concentration of the tetramethylammonium hydroxide (TMAH) solution is about 2 to 3%.

13. The method of claim 8, wherein the alkali treating the channel region further comprises cleaning the substrate, on which the source electrode and the drain electrode are formed, using deionized water (DI).

14. The method of claim 13, wherein the alkali treating the channel region further comprises drying the cleaned substrate.

* * * * *